United States Patent [19]

Umemura

[11] Patent Number: 4,598,368
[45] Date of Patent: Jul. 1, 1986

[54] SUPERPOSED IMAGE DISPLAY DEVICE

[75] Inventor: Yoshiyuki Umemura, Tochigi, Japan

[73] Assignee: Tokyo Shibaura Denki Kabushiki Kaisha, Kawasaki, Japan

[21] Appl. No.: 565,469

[22] Filed: Dec. 27, 1983

[30] Foreign Application Priority Data

Dec. 27, 1982 [JP] Japan ................................ 57-234028
Dec. 28, 1982 [JP] Japan ................................ 57-233519
Dec. 28, 1982 [JP] Japan ................................ 57-233537

[51] Int. Cl.$^4$ .................. G06F 15/42; G06F 7/38; H04N 5/32; G01T 1/20
[52] U.S. Cl. .................. 364/414; 364/724; 358/111; 250/369
[58] Field of Search ............ 364/414, 515, 724, 415, 364/416; 360/33; 378/98, 99; 358/111; 250/369

[56] References Cited

U.S. PATENT DOCUMENTS

| | | | |
|---|---|---|---|
| 3,848,130 | 11/1974 | Macovski | 250/369 |
| 3,928,755 | 12/1975 | Bellanger | 364/724 |
| 4,029,963 | 6/1977 | Alvarez et al. | 250/369 |
| 4,063,082 | 12/1977 | Nussbaumer | 364/724 X |
| 4,125,866 | 11/1978 | van Essen et al. | 364/724 |
| 4,157,572 | 6/1979 | Kennedy et al. | 360/33 |
| 4,233,662 | 11/1980 | LeMay | 364/414 |
| 4,350,998 | 9/1982 | Verhoeven | 358/111 |
| 4,476,497 | 10/1984 | Oshikoshi et al. | 364/414 |
| 4,503,461 | 3/1985 | Nishimura | 364/414 |
| 4,507,681 | 3/1985 | Verhoeven et al. | 358/111 |

FOREIGN PATENT DOCUMENTS 2030698A 4/1980 United Kingdom .

OTHER PUBLICATIONS

Twogood and Sommer, "Digital Image Processing", *IEEE Transactions on Nuclear Science*, vol. NS-29, No. 3, Jun. 1982, pp. 1076-1086.
European Patent Office Action, Sep. 12, 1984, Concerning European Applic. No. 83113151.1-2203.
Gebauer et al., "Image Processing in Angiography", *Medical Progress Through Technology*, vol. 1, No. 3, 1972, pp. 115-124.

Primary Examiner—Jerry Smith
Assistant Examiner—Jon D. Grossman
Attorney, Agent, or Firm—Finnegan, Henderson, Farabow, Garrett & Dunner

[57] ABSTRACT

There is provided a superposed image display device to display image signals from a plurality of image diagnostic apparatuses such as an X-ray CT apparatus, NMR CT apparatus, etc. This display device comprises memories to store the image signals from the CT apparatuses and NMR CT apparatus, multipliers to multiply the image signals read out from the memories by K1 and K2, an adder to add the output signals of the multipliers, and a display device to display the output signal of the adder.

11 Claims, 27 Drawing Figures

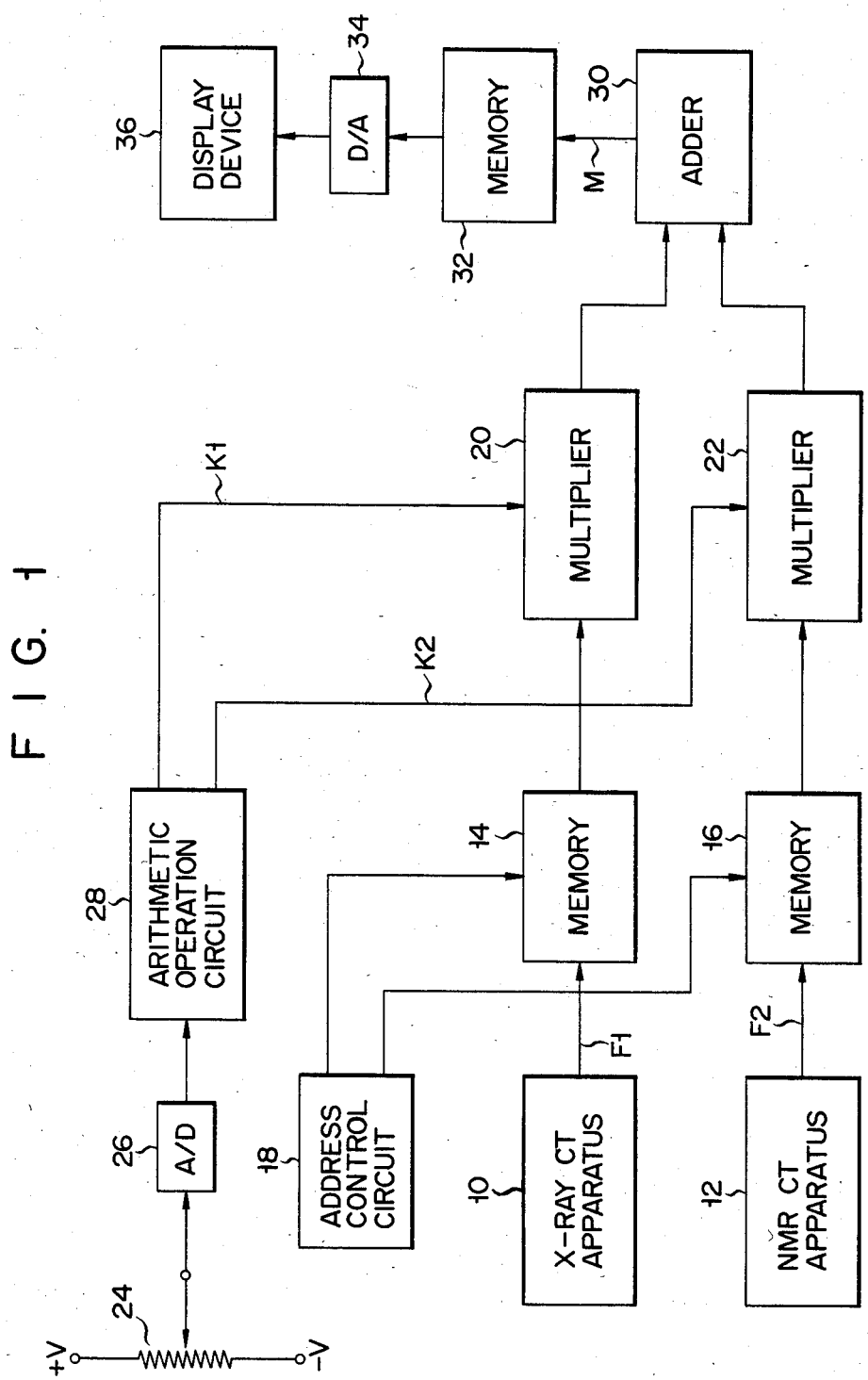
F I G. 1

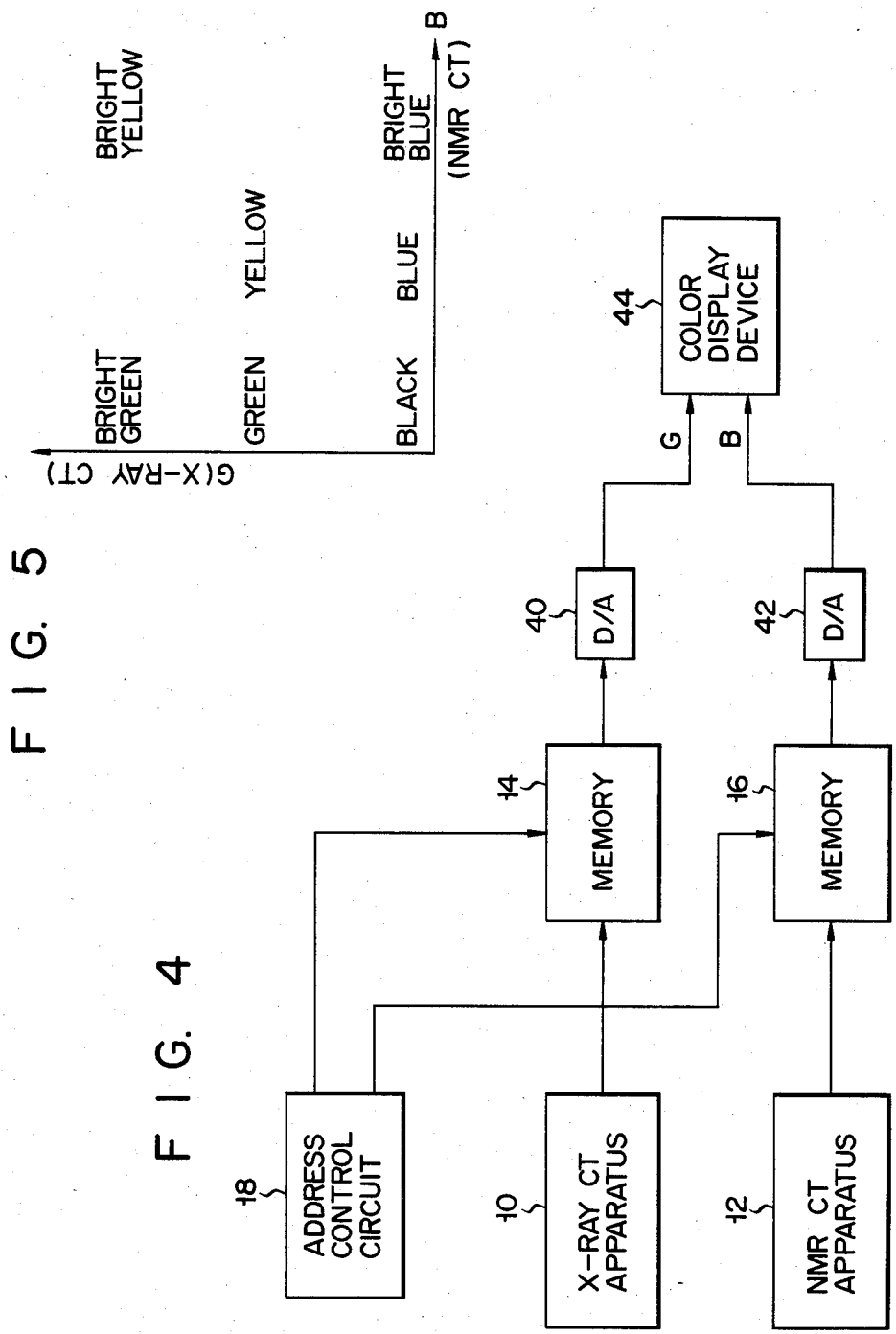

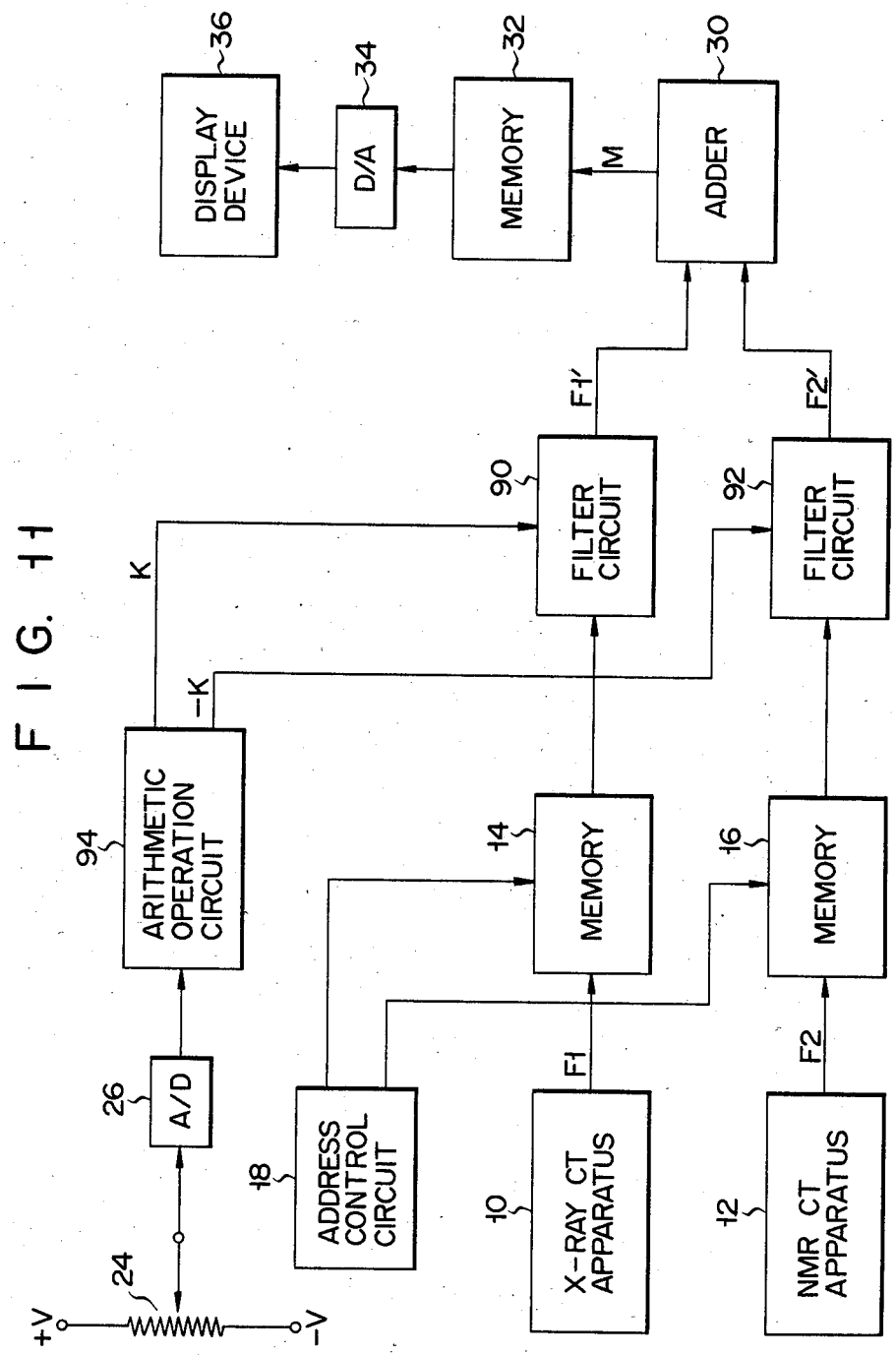

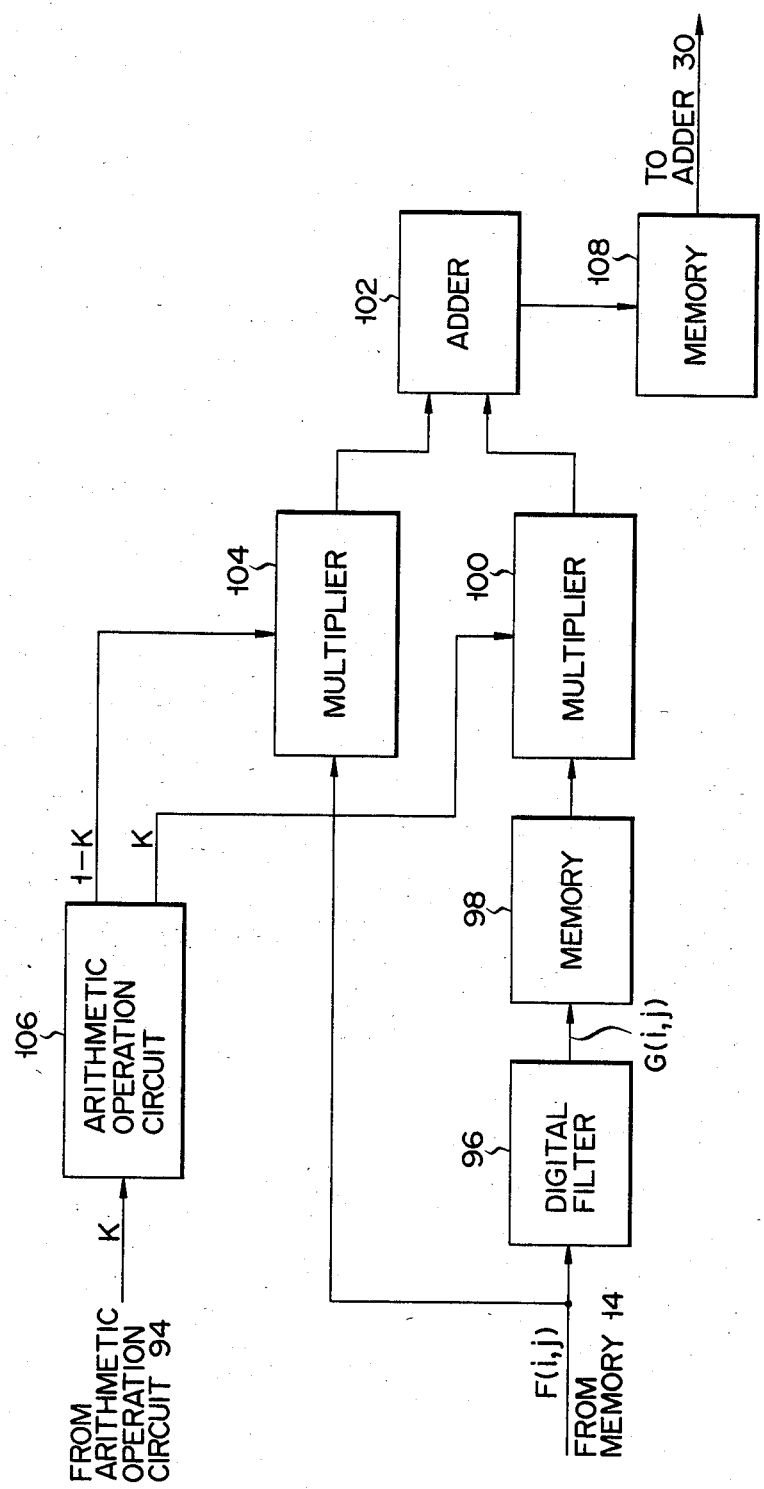

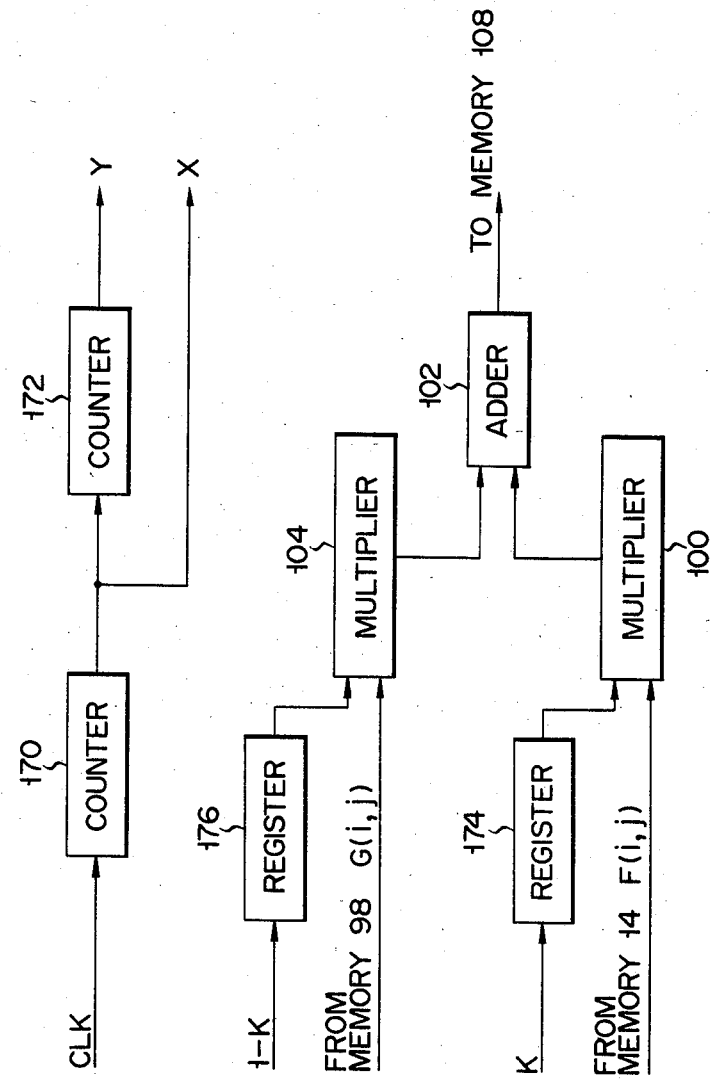
F I G. 15

SUPERPOSED IMAGE DISPLAY DEVICE

BACKGROUND OF THE INVENTION

The present invention relates to a superposed image display device which displays a plurality of images, particularly a plurality of images obtained by a plurality of different image diagnostic apparatuses.

Conventionally, as medical image diagnostic apparatuses, there have been known X-ray diagnostic apparatus, ultrasonic diagnostic apparatus, X-ray CT apparatus, nuclear-medicine diagnostic apparatus, digital radiography apparatus, NMR CT apparatus, etc. In the X-ray CT apparatus, a distribution of X-ray absorption coefficients on the cross sectional plane of a subject is obtained. In the nuclear-medicine diagnostic apparatus, a distribution of a dosed radioactive isotope is obtained. In the digital radiography apparatus, an X-ray fluoroscopic image is converted into digital data and is subjected to image processing. In the NMR CT apparatus, a distribution of hydrogen atomic nucleus is obtained due to nuclear magnetic resonance. In general, in order to securely diagnose the disease of a subject, it is desirable to photograph the same part by a plurality of image diagnostic apparatuses and to complementarily use the images of the same part having a plurality of different organism information, thereby synthetically diagnosing the disease.

For this purpose, an image display device to display a plurality of images is needed. Primitive viewing boxes are known wherein image films obtained from a plurality of image diagnostic apparatuses are arranged on a frosted glass on top of the viewing box (schaukasten) and the doctor watches and compares them. As other more advanced display devices, there is known a display device in which the images obtained from a plurality of image diagnostic apparatuses are arranged and displayed in one frame (multiframe display), and a display device in which the contour of another image is overlapped on one image and they are together displayed.

However, the multiframe display is effectively the same as the viewing box on which a plurality of images are arranged. Therefore, it is difficult to intuitively grasp the positional relationship between the plurality of images.

In addition, according to the contour display device, although the mutual positional relationship can be easily grasped, it takes a long calculation time to extract the contour and the contour lacks the detailed information which the original picture inherently has; consequently, it is impossible to promptly and accurately diagnose.

SUMMARY OF THE INVENTION

It is an object of the present invention to provide a superposed image display device which can superpose and display a plurality of images obtained from various kinds of image diagnostic apparatuses with respect to the same part of a subject.

This object is realized by a superposed image display device comprising a memory to memorize a plurality of image signals obtained by photographing the same part by a plurality of image diagnostic apparatuses, a superposing circuit to perform a predetermined image processing to each of a plurality of image signals read out from the memory, thereby to add processed image signals, and a display device to display an output signal of the superposing circuit.

BRIEF DESCRIPTION OF THE DRAWINGS

FIG. 1 is a block diagram of a first embodiment of a superposed image display device according to the present invention;

FIG. 4 is a block diagram of a second embodiment according to the present invention;

FIG. 5 is a diagram showing a color distribution of the superposed image according to the second embodiment;

FIG. 11 is a block diagram of the fifth embodiment;

FIG. 12 is a detailed block diagram of the filter circuit in the fifth embodiment;

FIG. 15 is a further detailed block diagram of the filter circuit of FIG. 12.

DETAILED DESCRIPTION OF THE PREFERRED EMBODIMENTS

Figure 2:
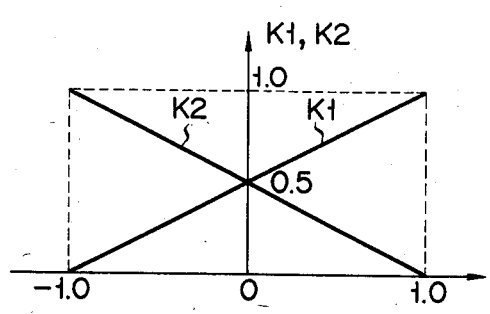
FIG. 2 is a graph showing coefficients K1 and K2 of multipliers in the first embodiment.
Figure 3A:
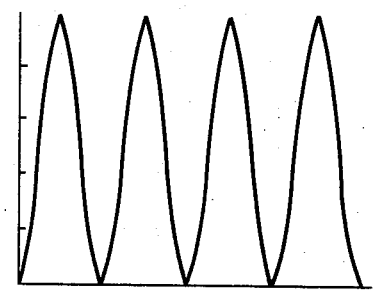
FIGS. 3A to 3E are graphs showing the states of the profile curves of the superposed images when coefficients K1 and K2 change.
Figure 3B:
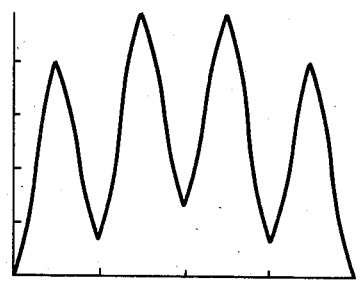
Figure 3C:
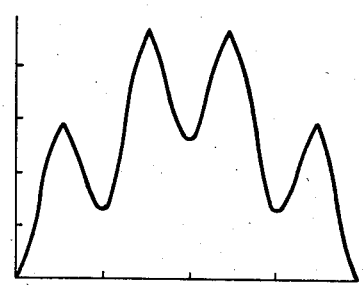
Figure 3D:
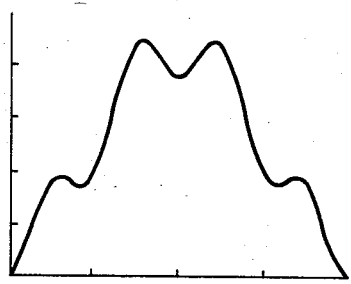
Figure 3E:
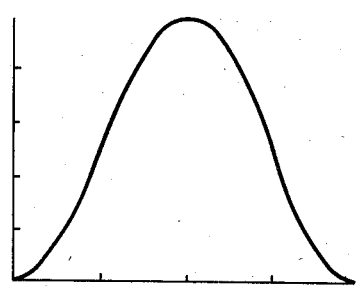

One embodiment of a superposed image display device according to the present invention will be described with reference to the drawings. In the following description, an X-ray tomography image and an NMR tomography image are mentioned as images to be superposed and displayed; however, the invention is not limited to the combination of those two kinds of images and, moreover, a combination of three or more kinds of images may be used. FIG. 1 is a block diagram showing a first embodiment. As means for superposing images, the first embodiment uses a linear coupling method whereby the respective images are individually weighted and superposed. In the first embodiment, memories (frame memories) 14 and 16 are connected to an X-ray CT apparatus 10 and to an NMR CT apparatus 12. Both CT apparatuses 10 and 12 output data of each picture element of a tomography image of one frame as digital signals and have the same number of picture elements per frame. Each picture element data is output from both CT apparatuses 10 and 12 in accordance with predetermined scan sequences. The picture element data are stored in the memories 14 and 16 of the addresses corresponding to the locations of the picture elements. An address control circuit 18 is connected to the memories 14 and 16 for these address controls. The picture element data read out from the memories 14 and 16 are input to multipliers 20 and 22, respectively.

An output of a potentiometer 24, namely an arbitrary voltage between +V and −V, is input through an A/D converter 26 to an arithmetic operation circuit 28. The arithmetic operation circuit 28 obtains weight coefficients K1 and K2 of images on the basis of the level of this input signal (this method of obtaining K1 and K2 will be described later) and supplies these coefficients to the multipliers 20 and 22, respectively. The potentiometer 24 and A/D converter 26 may be replaced by a key input apparatus which can directly set a value, or the like.

The multipliers 20 and 22 give the weights of K1 and K2 to the output data of the memories 14 and 16, respectively, and supply the weighted data to an adder 30, where the weighted data are added. The address control circuit 18 supplies the same read address to the memories 14 and 16 so that the output data from the memories 14 and 16 are added with respect to the same address, i.e. for the same picture elements. The output data of the adder 30 is once stored in a memory 32. The data from the memory 32 is supplied through a D/A converter 34 to a display device 36 (monochrome display).

The operation of the first embodiment will now be described. Firstly, a tomography image of a diagnostic part of a subject is obtained by either one of the X-ray CT or NMR CT apparatus and is written in the corresponding memory 14 or 16. Next, a tomography image of the same part is obtained by the other CT apparatus after adjusting the magnification and angle and is written in the corresponding memory 14 or 16. Thus, two kinds of tomography images with respect to the same part are written in the memories 14 and 16. Now, assuming that the data of the (i, j) picture elements of the X-ray tomography image and NMR tomography image are F1(i, j) and F2(i, j), the output M(i, j) of the adder 30 is expressed as follows since both of them are weighted by K1 and K2 by the multipliers 20 and 22, respectively, and are added by the adder 30.

$$M(i,j) = K1 \times F1(i,j) + K2 \times F2(i,j) \quad (1)$$

Since the tomography image data of the same part are stored in the memories 14 and 16, the output of the adder 30 represents the superposed image of which the two tomography images are overlapped.

The rate of the original images F1 and F2 in the superposed image M is determined by coefficients K1 and K2. Furthermore, if K1 and K2 are expressed as the following equation (2) using a parameter C, it is possible to simultaneously change K1 and K2 by changing one parameter C, thereby changing the rates of F1 and F2 in the superposed image M.

$$\left. \begin{array}{l} K1 = \frac{1}{2}C + \frac{1}{2} \\ K2 = -\frac{1}{2}C + \frac{1}{2} \end{array} \right\} \quad (2)$$

A value of C may be changed from −1 to +1 since both K1 and K2 have values of 0 to 100%. When C=1, K1=1 and K2=0, so that the superposed image M is the X-ray tomography image F1 itself. When C approaches 0, the rate of the X-ray tomography image F1 decreases, while the rate of the NMR tomography image F2 increases. When C=0, K1=K2=0.5 and the rates of both images become equal. When C further decreases toward −1, the rate of the X-ray tomography image F1 decreases. When C=−1, the rate of the NMR tomogaphy image F2 increases and K1=0 and K2=1, so that the superposed image M becomes the NMR tomography image F2 itself. The relation of equation (2) is shown in FIG. 2. FIGS. 3A to 3E show changes of the profile curves of the superposed image M in accordance with a change of C (C=1.0 to −1.0). Namely, FIGS. 3A, 3B, 3C, 3D, and 3E show the profile curves when C=1.0, 0.5, 0.0, −0.5, and −1.0, respectively. It can be understood from FIGS. 3A to 3E that it is possible to obtain the superposed image of the X-ray tomography image and NMR tomography image superposed at arbitrary rates by changing C.

In this embodiment, the arithmetic operation circuit 28 obtains coefficients K1 and K2 based on equation (2) using the output voltage (+V to −V) of the potentiometer 24 as a parameter C. Therefore, by changing the output voltage of the potentiometer 24, the superposed image M(i,j) to be output from the adder 30 changes as shown in FIGS. 3A to 3E. After the superposed image M(i,j) to be output from the adder 30 has been once stored in the memory 32, it is displayed by the display device 36.

As described in the above, according to the present embodiment, two tomography images are superposed and are displayed on the display device. At this time, a desired weight can be given to each image when two images are superposed and it is also possible to freely change its weight; therefore, it is also possible to easily watch the details of only the individual images and to easily synthetically diagnose by comparing them. In addition, since two images are simply weighted and superposed, it takes a short time for calculation, thereby enabling a prompt and accurate diagnosis.

A second embodiment of the superposed image display device according to the present invention will now be described. FIG. 4 is a block diagram of the second embodiment. The circuit constitution until the output signals of the X-ray CT apparatus 10 and NMR CT apparatus 12 are stored in the memories 14 and 16 is the same as that of the first embodiment. The output signals of the memories 14 and 16 are input to an input terminal for a green signal and an input terminal for a blue signal of a color display device 44 through D/A converters 40 and 42, respectively. The signal read-out operations from the memories 14 and 16 are performed in the manner such that the data with respect to the same picture element are simultaneously read out under the control of the address control circuit 18.

Therefore, according to this embodiment, the X-ray tomography image is displayed as a green image, the NMR tomography image is displayed as a blue image, and the both images are superposed, i.e. the superposed image is displayed on the color display device 44. Thus, for a certain picture element, if it is subject to influence of the X-ray tomography image, this picture element will become green; on the contrary, if it is subject to influence of the NMR tomography image, it will become blue. If the components of both images are equal, the picture element will become yellow which is an intermediate color between green and blue. This state is shown in FIG. 5. As described above, each picture element of the superposed image is displayed by different colors in accordance with that either one of the X-ray tomography image and NMR tomography image is more dominant than the other; therefore, it is possible to promptly discriminate the displayed picture element whether it was obtained by the X-ray CT apparatus or by the NMR CT apparatus. Furthermore, the superposed image is easy to see and the information is not lost when superposing the images. In addition, since both tomography images are obtained with respect to the same position in accordance with the same magnification, same profile and same number of picture elements, it is possible to superposed and display both images by merely inputting to different color signal input terminals of the color display device, so that arithmetic processing is unnecessary.

Figure 6:
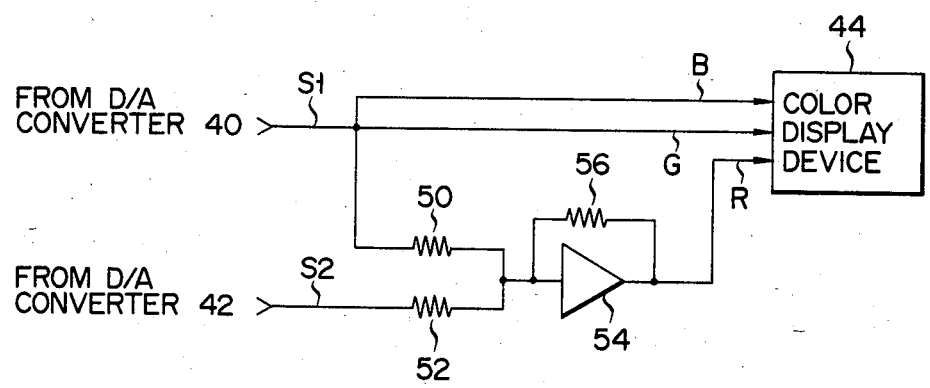
FIGS. 6 and 7 are block diagrams of third and fourth embodiments.

Although both images are colored in the second embodiment, the NMR and X-ray tomography images are ordinarily monochromically displayed. Now, an embodiment whereby one of the images is monochromically displayed and while the other is color displayed will be then described as a third embodiment. FIG. 6 is a block diagram of the third embodiment. The output signals of the D/A converters 40 and 42 in the second embodiment are indicated by S1 and S2. The signal S1 is supplied to the green signal input terminal and blue signal input terminal of the color display device 44. The signals S1 and S2 are supplied to an input terminal of an operational amplifier 54 through resistors 50 and 52. A feedback resistor 56 is connected between the input and output terminals of the operational amplifier 54. The output signal of the operational amplifier 54 is input to the red signal input terminal of the color display device 44.

In the third embodiment of FIG. 6, the resistors 50, 52 and 56, and the operational amplifier 54 together constitute an adder, thereby adding the signals S1 and S2 and supplying the added signal to the red signal input terminal. The resistance values of the resistors 50 and 52 are equal. Therefore, the signals S1 and S2 are added at the rates of 1:1 and are input to the red signal input terminal of the color display device 44. Since the signal S1 is also input to the blue and green signal input terminals, the signal S1 is monochromically displayed, while the signal S2 is displayed in red. With such a constitution, it is possible to display the X-ray tomography image monochromically and the NMR tomography image in red.

Figure 7:
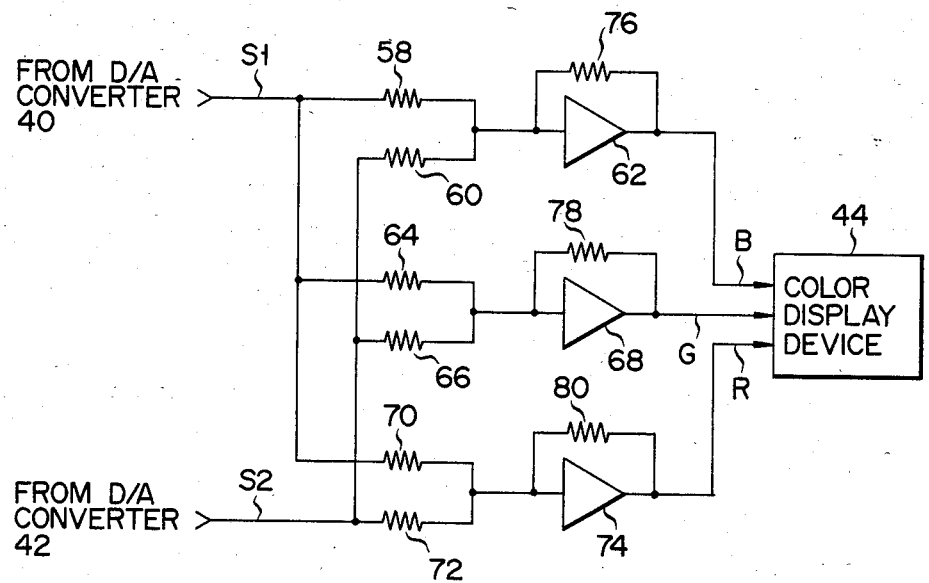

With reference to FIG. 7, a fourth embodiment will now be described whereby two images can be displayed in arbitrary colors. In the fourth embodiment, the signals S1 and S2 are added at predetermined rates, respectively, and are input to the blue, green and red signal input terminals of the color display device 44. The signals S1 and S2 are input through resistors 58 and 60 to an operational amplifier 62; through resistors 64 and 66 to an operational amplifier 68; and through resistors 70 and 72 to an operational amplifier 74. Feedback resistors 76, 78 and 80 are respectively connected between the input and output terminals of each of the operational amplifiers 62, 68 and 74. The output signals of the operational amplifiers 62, 68 and 74 are input to the blue, green and red signal input terminals of the color display device 44, respectively.

According to such an arrangement as described above, each adder can set the rates of the resistors 58, 60; 64, 66; and 70, 72 into appropriate rates instead of 1:1, thereby enabling the two images to be arbitrarily colored and displayed.

As described above, according to the second to fourth embodiments, since the two images can be superposed and displayed using different colors, it is possible to intuitively grasp the relationship between both images without making the picture quality of each image worse, thereby enabling a prompt and synthetic diagnosis to be performed.

A fifth embodiment of the superposed image display device according to the present invention will now be described. Although two picture images can be distinguished by changing the weights or colors when superposing the two images in the above embodiments, in this embodiment, they are discriminated by changing the spatial frequency characteristics of the two images. The principle of this fifth embodiment will be first desicrbed.

Figure 8:
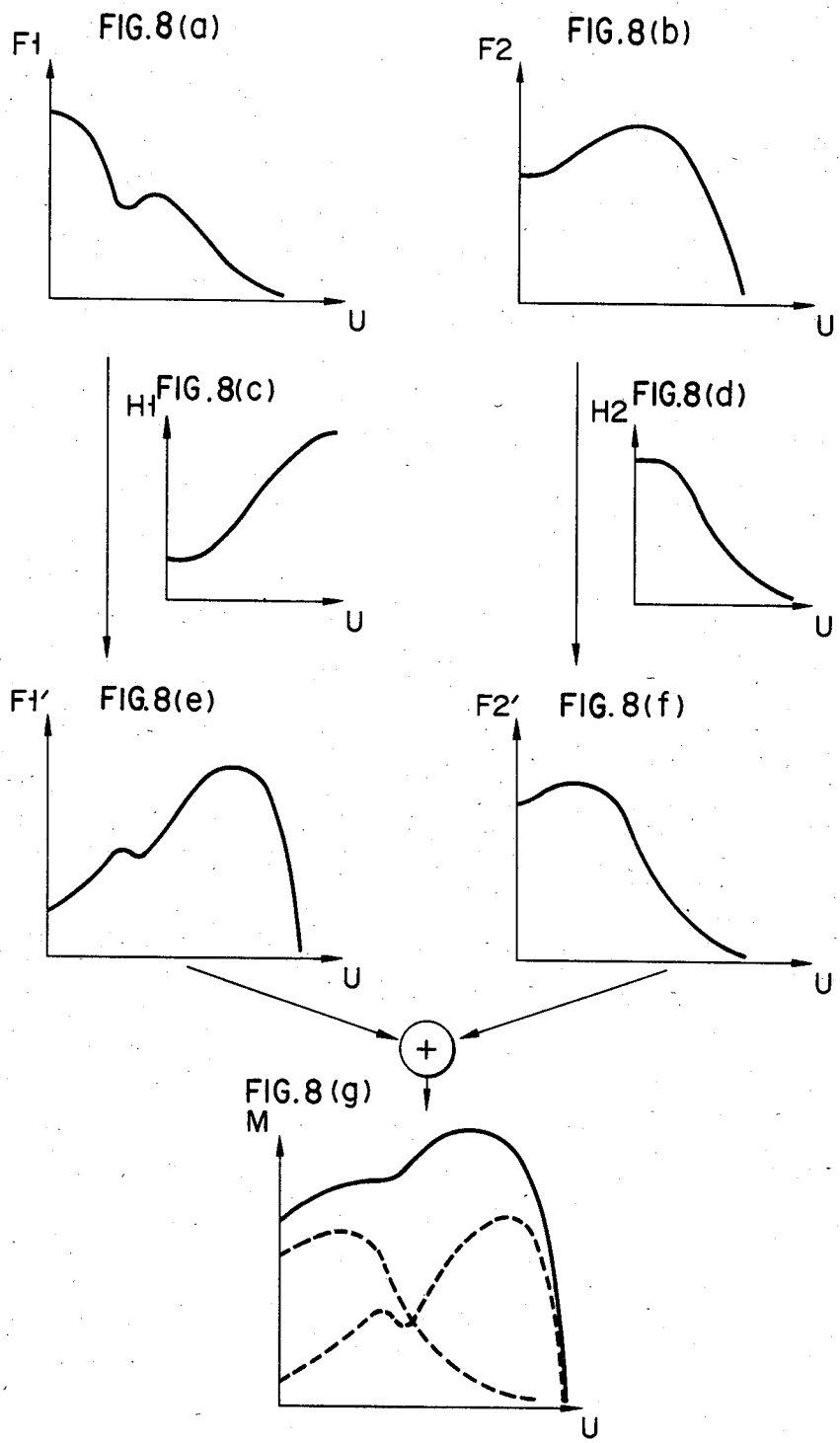
FIGS. 8a–g are diagrams showing spatial frequency characteristics of the image to show the principle of a fifth embodiment.

A spatial filter is employed for changing the spatial frequency characteristics of an image. Specifically, one image is allowed to pass through a high-pass filter to emphasize the edge of that image, while the other image is permitted to pass through a low-pass filter for smoothing, thereafter both images are added to form a superposed picture image. Due to this, since the edge-emphasized image is superposed on the smoothed image, both images can be distinguished and the picture qualities of both images are not reduced. This state is shown in FIG. 8. In FIG. 8, a graph (a) denotes a spatial frequency distribution of the X-ray tomography image F1, while a graph (b) represents a spatial frequency distribution of the NMR tomography image F2. The spatial frequency u is indicated as an axis of abscissa. When filtering the X-ray tomography image F1 by means of a high-pass filter H1 as shown in (c), a spatial frequency distribution F1' as shown in (e) is obtained. Similarly, when filtering the NMR tomography image F2 by means of a low-pass filter H2 as shown in (d), a spatial frequency distribution F2' as shown in (f) is obtained. These filtered images F1' and F2' are added to obtain a superposed image M as shown in (g). It will be appreciated from (g) that the X-ray tomography image is displayed as the edge-emphasized image from which detailed changes can be easily seen and the NMR tomography image is displayed as the smoothed image and that they are superposed and are integrally displayed as a shape of which both images are distinguished. In addition, by changing the characteristic of the spatial filter, a superposed picture image having an arbitrary spatial characteristic can be obtained in accordance with the diagnostic object.

As a simple spatial filter, there is known a two-dimensional digital filter of linear stationary nonrecursive type of 3×3 support size which adds a picture element and the eight picture elements, around that picture element for every picture element, thereby filtering them. Assuming that the input image is indicated by X(i,j) and the output image is represented by Y(i,j), such a digital filter is represented by the following expression, wherein a, b and c denote filter coefficients:

$$Y(i,j) = cX(i-1, j-1) + bX(i, j-1) + \quad (3)$$
$$cX(i+1, j-1) + bX(i-1, j) +$$
$$aX(i,j) + bX(i+1, j) + cX(i-1, j+1) +$$
$$bX(i, j+1) + cX(i+1, j+1)$$

The transfer function of the filter is expressed as follows.

$$H(u, v) = 2c \cos(u+V) + 2b \cos v + 2c \cos(u-V) + 2b \cos u + a \quad (4)$$

where, u is a spatial frequency in the x direction
v is a spatial frequency in the y direction Now, assuming that the filter coefficients a, b and c in equation (3) are all 1/9, equation (4) is modified as follows.

$$H(u, v) = (2/9)\{\cos(u+v) + \cos v + \cos(u-v) + \cos u + \tfrac{1}{2}\} \quad (5)$$

Figure 9:
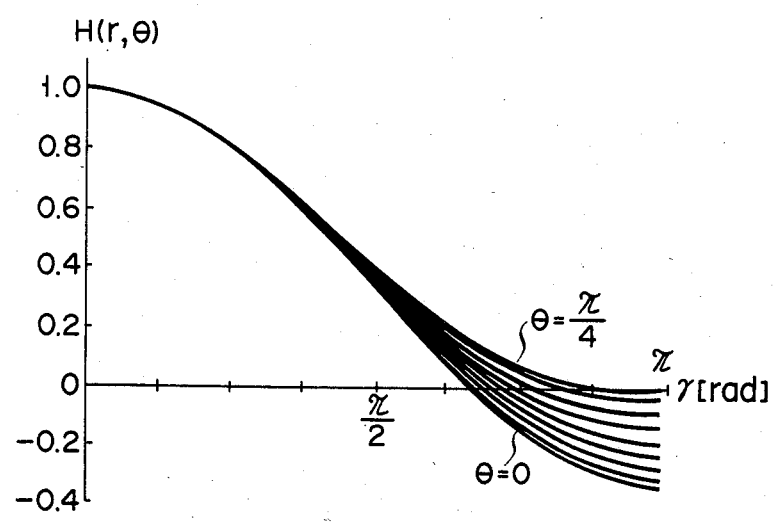
FIGS. 9 and 10 are diagrams showing characteristics of spatial filters to be used in the fifth embodiment.

When the orthogonal coordinates (u,v) of equation (5) are converted into the polar coordinates (r,θ), the transfer function H(r,θ) is as shown in FIG. 9. When considering that the weights of 1−K and K are given to the original image and to the filtered image to be obtained by equation (5) and that they are linearly coupled, the whole spatial frequency characteristics of the coupled image will be as follows.

$$1 - K + K \cdot H(u, 0) \tag{6}$$

Figure 10:
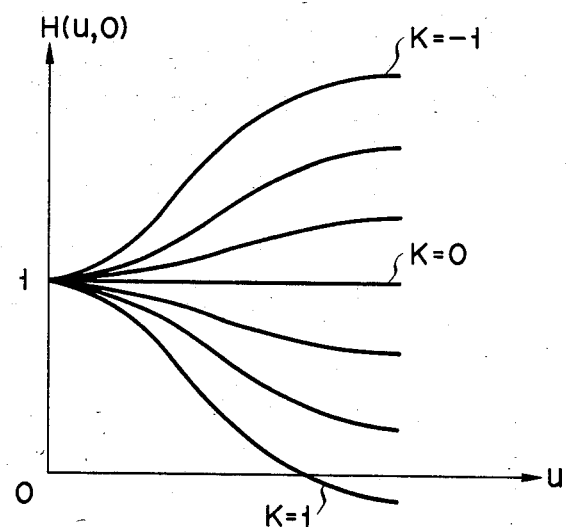

The characteristic of equation (6) is shown in FIG. 10 when K is used as a parameter. That is to say, the low-pass filter is realized when K=1, and a high-pass filter is realized when K=−1. A filter having an arbitrary characteristic is realized by changing K. By extracting two images with different spatial frequency bands by changing K and by superposing them, it is possible to emphasize the edge of one image and to smooth the other, thereby enabling the superposed image to be displayed by arbitrarily changing the states of the two images.

FIG. 11 shows a block diagram of a fifth embodiment of the basis of this principle as described above. The output signal of the memory 14 in which the output signal of the X-ray CT apparatus 10 is stored is supplied to the first input terminal of the adder 30 through a fitler circuit 90. The output signal of the memory 16 in which the output signal of the NMR CT apparatus 12 is stored is supplied to the second input terminal of the adder 30 through a filter circuit 92. The output of the potentiometer 24 is supplied through an A/D converter 26 to an arithmetic operation circuit 94, from which coefficients K and −K in response to the output of the potentiometer 24 are supplied to the filter circuits 90 and 92, respectively. The connections from the adder 30 to the display device 36 are the same as in the first embodiment.

A practical construction of the filter circuits 90 and 92 is shown in FIG. 12. FIG. 12 shows the filter circuit 90. In case of the filter circuit 92, K in FIG. 12 may be replaced by −K. The signal from the memory 14 is input to a digital filter 96. The characteristics of the filter 96 are given by equation (3). The output signal of the filter 96 is stored in a memory 98. The output signal of the memory 98 is multiplied by K by a multiplier 100 and is input to a first input terminal of an adder 102. The output signal of the memory 14 before filtering is multiplied by 1−K by a multiplier 104 and is input to a second input terminal of the adder 102. Multipliers K and 1−K of the multipliers 100 and 104 are produced from an arithmetic operation circuit 106 on the basis of coefficient K generated from the arithmetic operation circuit 94 on the basis of the output of the potentiometer 24. After the output signal of the adder 102 is stored in a memory 108, it is supplied to the first input terminal of the adder 30 and is added to the output of the filter circuit 92. In the filter circuit of FIG. 12, assuming that the transfer function of the digital filter 96 is H(u,0) and the spatial frequency characteristic of the output signal of the memory 14 is 1, the spatial frequency characteristic of the output signal of the adder 102 becomes 1−K+K·H(u,0) and is equal to equation (6). Namely, the filter circuit of FIG. 12 has the variable spatial frequency characteristic using K as a parameter as shown in FIG. 10. Parameters K and −K which have opposite signs to each other are given to the filter circuits 90 and 92. This is because the mutually opposite characteristics are given in such a manner that when one has a low-frequency pass characteristic, the other has a high-frequency pass characteristic as shown in FIG. 10.

Figure 13A:
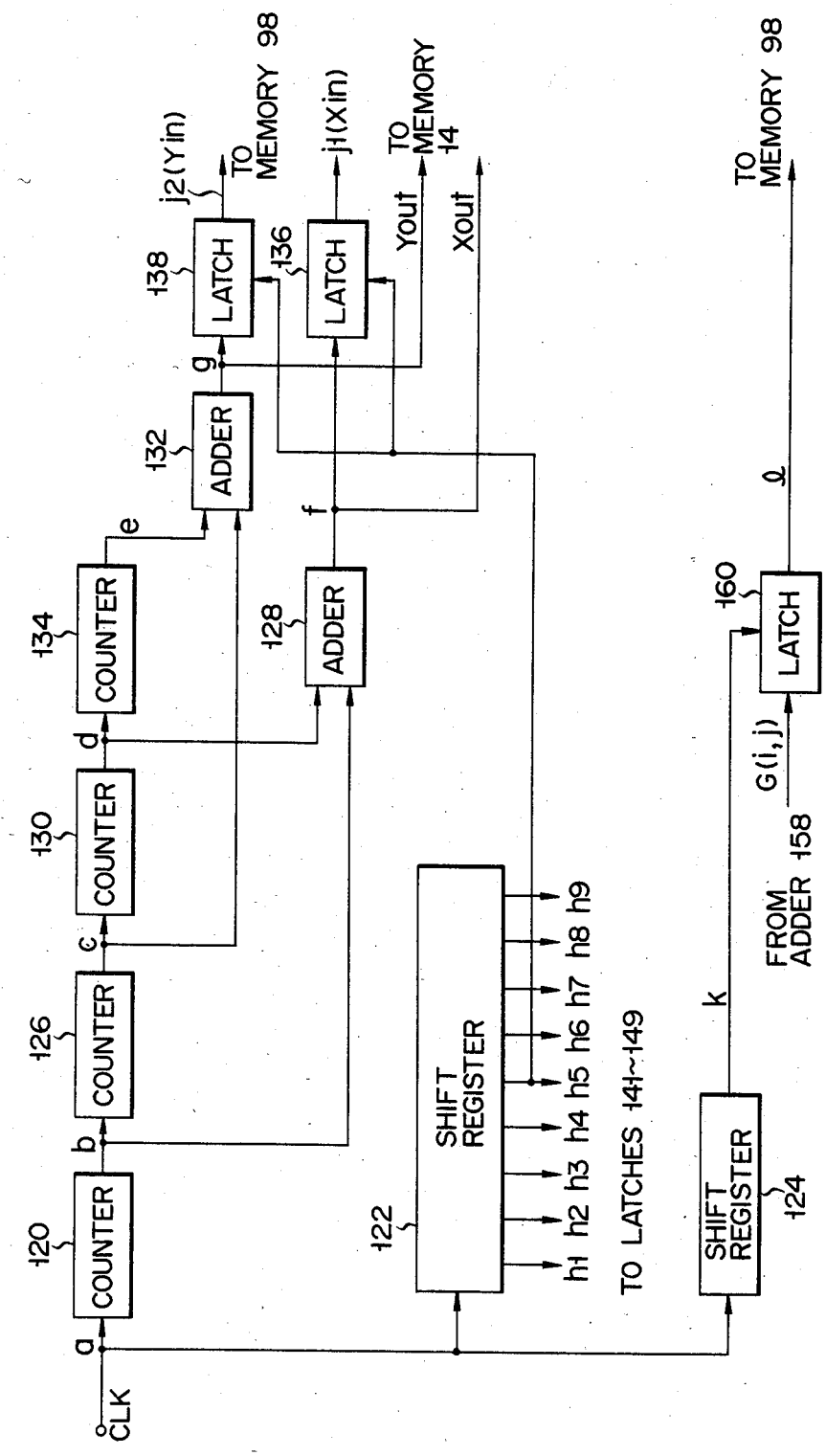
FIGS. 13A and 13B are detailed block diagrams of a digital filter in FIG. 12.
Figure 13B:
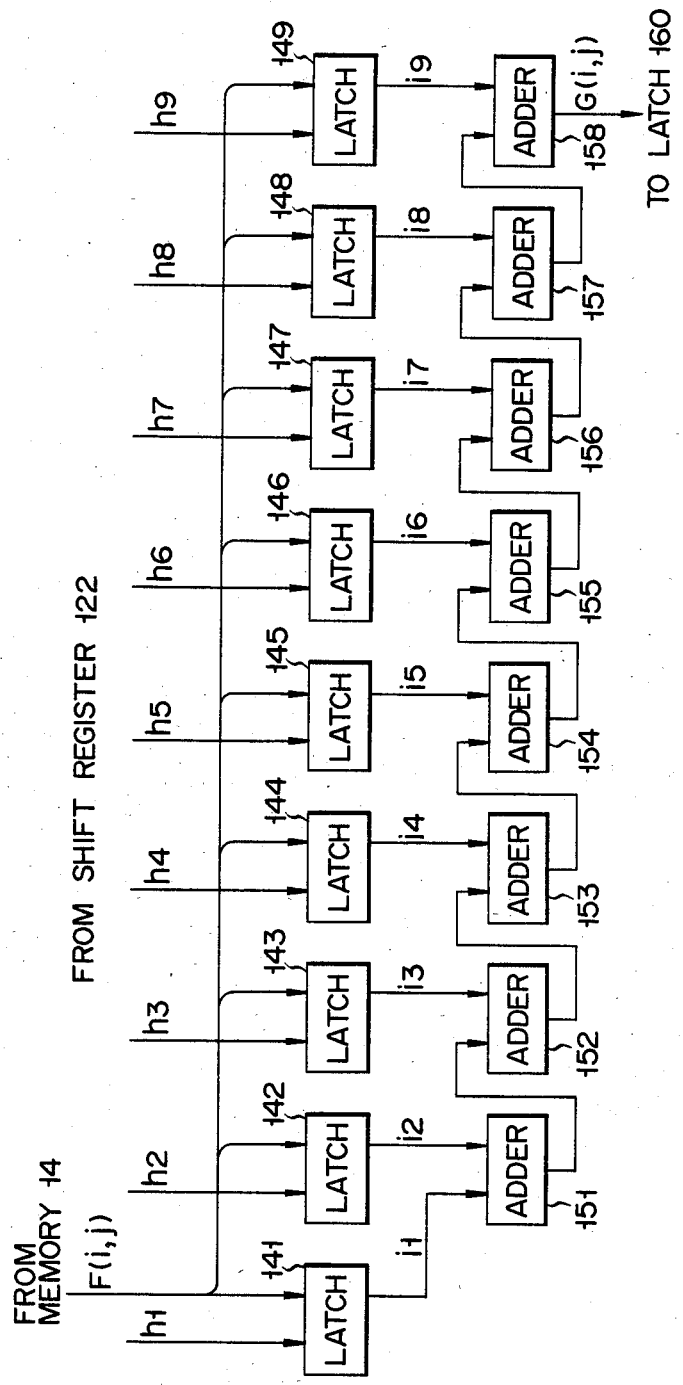
Figure 14A:
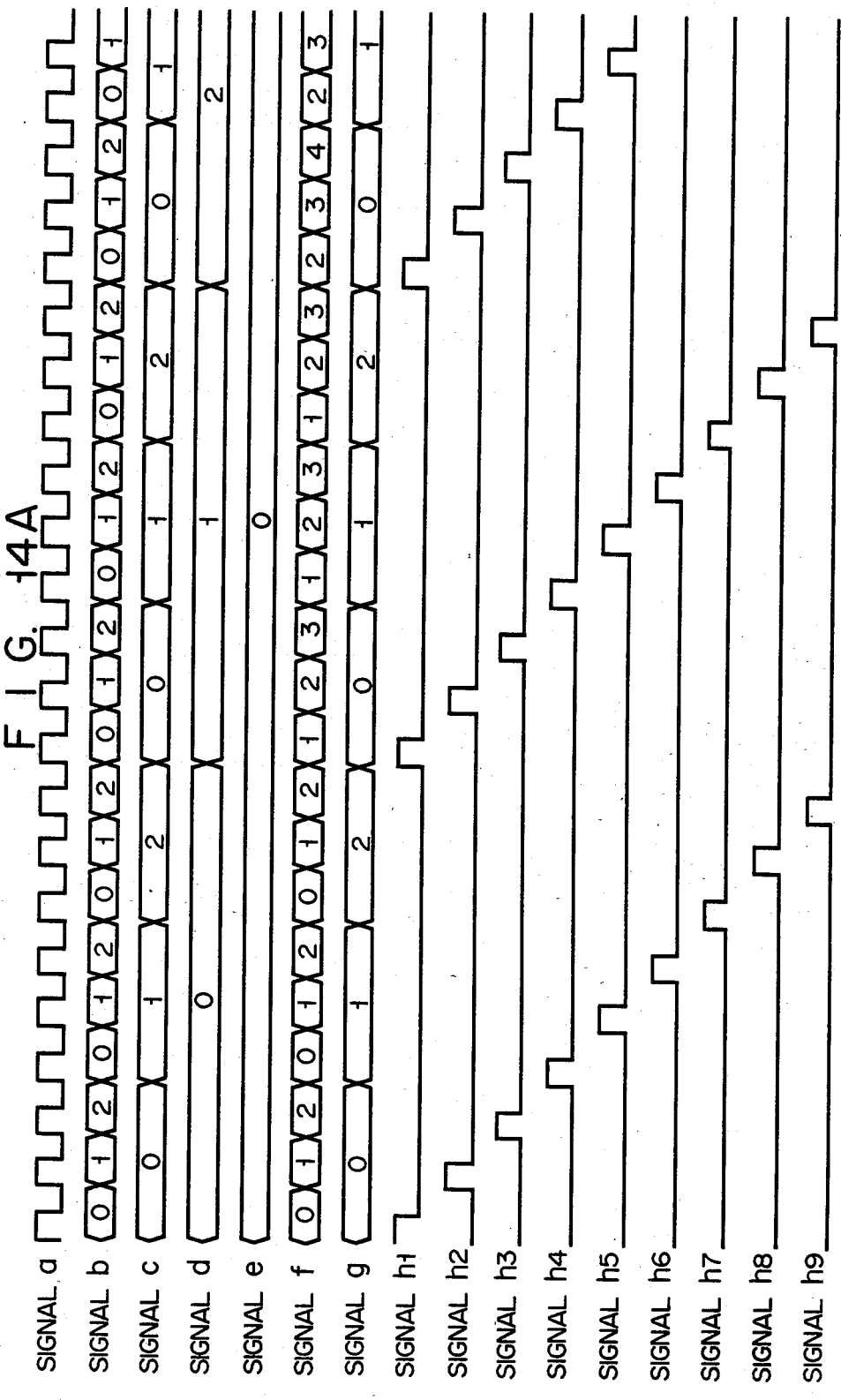
FIGS. 14A and 14B are timing charts of the digital filter of FIGS. 13A and 13B.
Figure 14B:
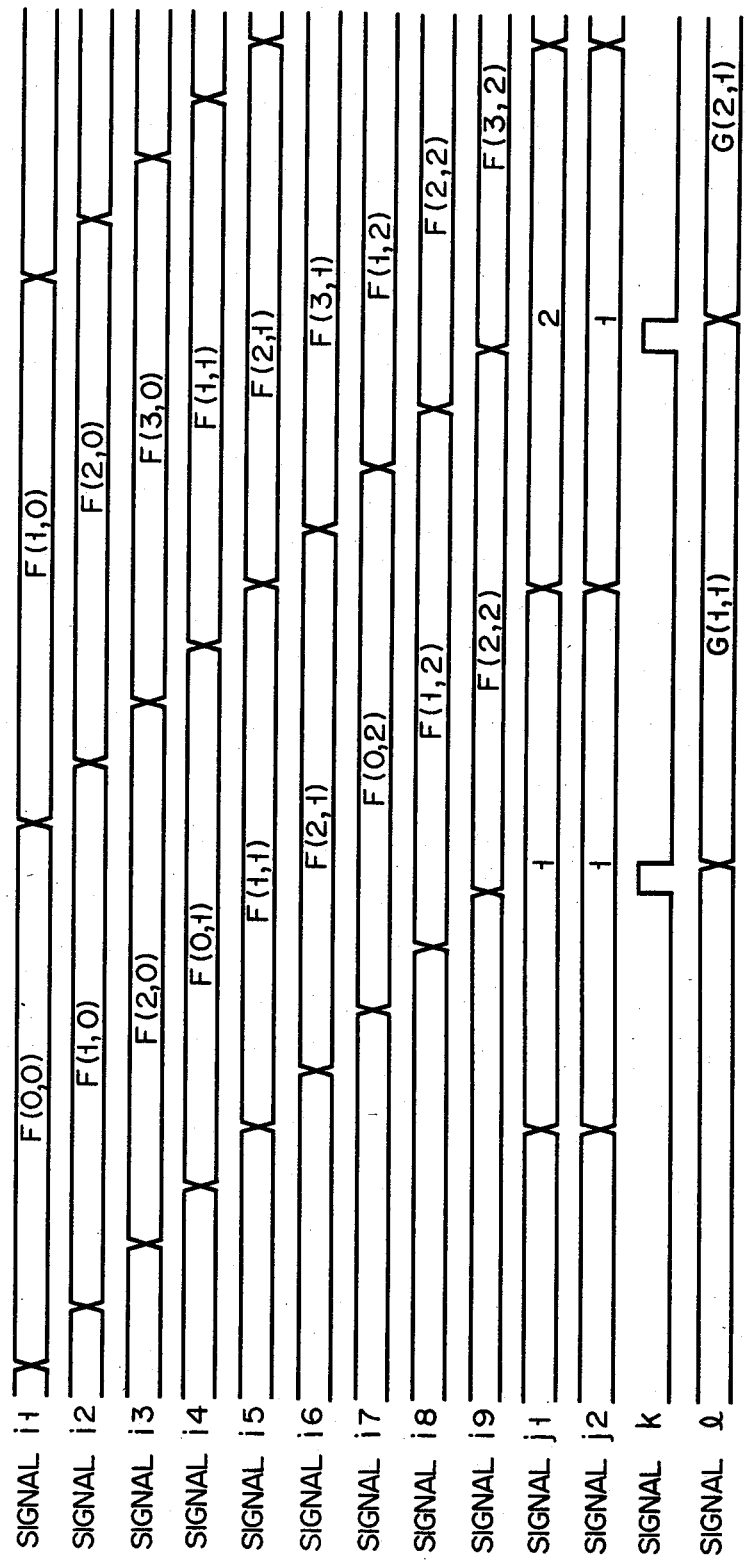

The details of the digital filter 96 will be described with reference to the circuit diagrams shown in FIGS. 13A and 13B and to the timing charts shown in FIGS. 14A and 14B. The number of picture elements of an image is set at 256×256. FIGS. 14A and 14B show signals a to l of each part in FIGS. 13A and 13B, wherein the time bases (axes of abscissa) are equal. The clock signal a is input to a two-bit counter 120 and shift registers 122 and 124. The counter 120 counts this clock signal a and supplies the output signal b which repeats values of "0", "1" and "2" at every period of the clock signal to a counter 126 and an adder 128. The counter 126 is also a two-bit counter and supplies the output signal c which repeats values of "0", "1" and "2" at every period ("0" to "2") of the signal b to a counter 130 and an adder 132. The counter 130 is an eight-bit counter and supplies the output signal d which repeats values of "0", "1", "2", ..., "255" at every period ("0" to "1") of the signal c to a counter 134 and the adder 128. The counter 134 is an eight-bit counter and supplies the output signal e which repeats values of "0", "1", "2", ..., "255" at every period ("0" to "255") of the signal d to the adder 132. The adder 128 adds the signals b and d and supplies the signal f to a latch circuit 136 and also supplies as a read address $X_{out}$ to the memory 14. The adder 132 adds the signals c and e and supplies the signal g to a latch circuit 138 and also supplies as a read address $Y_{out}$ to the memory 14. Due to this, the picture element to be filtered and the eight picture elements around that picture element, i.e. total nine picture elements are sequentially scanned and read out from the memory 14. After the readout operation of nine picture elements for filtering has been finished, the x coordinate is increased by +1 and then next picture elements are similarly read out. In this way, after the readout operations for one line in the x direction have been finished, and y coordinate is increased by +1. The picture element data (8 bits) read out from the memory 14 is supplied to latches 141 to 149. The readout period from the memory 14 for filtering of one picture element corresponds to nine clock periods. During these periods, signals h1 to h9 are sequentially output from the shift register 122 synchronously with each clock pulse and are supplied to the clock terminals of the latch circuits 141 to 149, respectively. The latch circuits 141 to 149 latch the signals F(i,j) from the memory 14 in response to the trailing edges of the signals h1 to h9, respectively. The output signals i1 to i9 of the latch circuits 141 to 149 are sequentially added by adders 151 to 158. Firstly, F(0,0), F(1,0), F(2,0), F(0,1), F(1,1), F(2,1), F(0,2), F(1,2), F(2,2) are latched to the latch circuits 141 to 149, respectively. Consequently, $$G(i,j) = \sum_{k2=-1}^{1} \sum_{k1=-1}^{1} F(i + k1, j + k2) \tag{7}$$

is output from the adder 158. Equation (7) is equivalent to equation (3) when a=b=c=1. The output G(i,j) of the adder 158 is input to a latch circuit 160.

On the other hand, the output signal h5 of the shift register 122 is input to the clock terminals of the latch circuits 136 and 138. The latch circuits 136 and 138 respectively latch the signals f and g in response to the trailing edge of the signal h5 and then supply the signals j1 and j2 as write address $X_{in}$ and $Y_{in}$ to the memory 98. The shift register 124 supplies a signal k at an intermediate timing between the signals h9 and h1 of the shift register 122 to the clock terminal of the latch circuit 160. The latch circuit 160 latches the output G(i,j) of the adder 158 in response to the trailing edge of the signal k and supplies the signal l as a filtering data to the memory 98.

In this way, the digital filter 96 performs the filtering of 3×3 to the original image data F(i,j) stored in the memory 14 and writes the filtering data G(i,j) into the memory 98.

FIG. 15 is a diagram of a circuit to add the original image data F(i,j) in the memory 14 in FIG. 12 and the filtering data G(i,j) in the memory 98 after giving proper weights thereto, thereby writing in the memory 108. The clock signal CLK is input to an eight-bit counter 170, from which the signal which repeats values of "0", "1", "2", ..., "255" at every clock period is output. The output signal of the counter 170 is supplied as an X address to the memories 14, 98 and 108 (as read addresses to the memories 14 and 98, and as a write address to the memory 108). The output signal of the counter 170 is further input to an eight-bit counter 172, from which the signal which repeats values of "0", "1", ..., "255" at every period ("0" to "255") of the input signal is output. The output signal of this counter 172 is suppied as a Y address to the memories 14, 98, 108. The original data F(i,j) and filtering data G(i,j) read out from the memories 14 and 98 by these X and Y addresses are multiplied by coefficinets K and 1−K stored in registers 174 and 176, and thereafter they are added and written in the memory 108.

In this way, the image data filtered by the filter with the spatial frequency characteristic including parameter K is stored in the memory 108.

As described above, according to the fifth embodiment, it is possible to superpose and display two images by filtering the two images on the basis of different spatial frequency characteristics. Therefore, this enables the accurate and synthetic discrimination without losing the information of two images. In addition, it is also possible to freely change the filtering characteristics by changing the output of the potentiometer 24.

What is claimed is:

1. A device for displaying an image of an object comprising:
   a first apparatus for generating a plurality of first image signals which each represent one of a plurality of picture elements comprising an image of said object obtained using a first imaging technique, said first apparatus including a first image signal pickup mechanism to obtain said first image signals;
   a second apparatus for generating a plurality of second image signals which each represent one of a plurality of picture elements comprising another image of said object obtained using a second imaging technique, said second apparatus including a second image signal pickup mechanism which is separate and distinct from said first image signal pickup mechanism;
   means for storing said first image signals at first address locations, with each first address location corresponding to the location in said object represented by the picture element corresponding to said first image signal stored at that first address location;
   means for storing said second image signals at second address locations, with each second address location corresponding to the location in said object represented by the picture element corresponding to said second image signal stored at that second address location;
   means for independently operating upon said stored first and second image signals;
   means for simultaneously displaying each operated upon first and second image signal from first and second address locations corresponding to the same location in said object.

2. A device of claim 1 wherein said operating means includes means for outputting at the same time, from said first and second means for storing, first and second image signals corresponding to the same location in said object.

3. A device of claim 2 wherein said operating means further includes first and second means for multiplying said first and second image signals by respective adjustable first and second coefficients upon outputting of said signals from said first and second means for storing.

4. A device of claim 3 wherein the sum of said first and second coefficients is 1.

5. A device of claim 3 wherein said means for simultaneously displaying includes an adder coupled to add together outputs of said first and second means for multiplying.

6. A device of claim 2 wherein said operating means further includes first and second means for spatially filtering said first and second image signals with respective adjustable first and second spatial frequency characteristics.

7. A device of claim 6 wherein said first and second means for spatially filtering each comprises a linear stationary non-recursive 3×3 type digital filter.

8. A device of claim 6 wherein said first and second means for spatially filtering each comprises a digital filter, a temporary memory, first and second multipliers and an adder, with said digital filter and said first multiplier coupled to receive the same image signals, said temporary memory coupled to store filtered image signals from said digital filter, said second multiplier coupled to receive said image signals stored in said temporary memory, and the outputs of said first and second multipliers coupled to first and second inputs of said adder to be combined through operation of said adder.

9. A device of claim 6 wherein said first and second means for spatially filtering includes an adder coupled to add together outputs of said first and second means for spatially filtering.

10. A device of claim 1 wherein said means for simultaneously displaying includes a color display device having first and second color signal input terminals to which said operated upon first and second image signals are respectively coupled.

11. A device of claim 1 wherein said means for simultaneously displaying includes a color display device having first and second color signal input terminals and means for selectively mixing said operated upon first and second imaging signals to provide resultant first and second mixed signals, respectively, and means for coupling said first and second mixed signals to said first and second signal output terminals of said color display device, respectively.

* * * * *